United States Patent
Hirai (10) Patent No.: US 7,374,456 B2
(45) Date of Patent: *May 20, 2008

(54) RADIATION NOISE MINIMIZING SHIELDING CASING

(75) Inventor: Koji Hirai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/769,053

(22) Filed: Jun. 27, 2007

(65) Prior Publication Data
US 2007/0249229 A1   Oct. 25, 2007

Related U.S. Application Data

(63) Continuation of application No. 11/418,664, filed on May 5, 2006, now Pat. No. 7,249,973.

(30) Foreign Application Priority Data

May 11, 2005 (JP) .............................. 2005-137971
Apr. 17, 2006 (JP) .............................. 2006-113425

(51) Int. Cl.
   *H01R 13/648* (2006.01)
(52) U.S. Cl. ...................................... 439/607
(58) Field of Classification Search ................ 439/607, 439/608, 609, 610, 108
   See application file for complete search history.

(56) References Cited

U.S. PATENT DOCUMENTS

| 5,934,940 A | 8/1999 | Maranto et al. |
| 6,168,467 B1 | 1/2001 | Chiou |
| 6,599,151 B2 * | 7/2003 | Chiran et al. ............... 439/610 |
| 6,629,859 B2 | 10/2003 | Hoshino et al. |
| 7,094,103 B2 | 8/2006 | Lai |
| 7,128,607 B2 * | 10/2006 | Li .............................. 439/607 |
| 7,175,465 B1 * | 2/2007 | Tsai ........................... 439/352 |

FOREIGN PATENT DOCUMENTS

JP         8-32762         2/1996

* cited by examiner

*Primary Examiner*—Chandrika Prasad
(74) *Attorney, Agent, or Firm*—Morgan & Finnegan, LLP (57) ABSTRACT

A tube-shaped electroconductive member is attached to a shielding casing from the inside of the shielding casing so as to surround an opening formed in the shielding casing, and two slits are formed in an axial direction of the tube-shaped electroconductive member so as to extend from an end position thereof far away from the opening, thereby preventing a noise component having a specific frequency emitted as radiation noise from the opening formed in the shielding casing which functions as an slot antenna.

6 Claims, 11 Drawing Sheets

PRIOR ART

FIG. 11A

PRIOR ART

FIG. 11B

PRIOR ART

FIG. 12

PRIOR ART

FIG. 13A

PRIOR ART

FIG. 13B

PRIOR ART

RADIATION NOISE MINIMIZING SHIELDING CASING

CROSS-REFERENCE TO RELATED APPLICATIONS

This application is a continuation of U.S. patent application Ser. No. 11/418,664 filed May 5, 2006 now U.S. Pat. No. 7,249,973 under 35 U.S.C. §120, which claims priority to Japanese Patent Application Nos. 2005-137971 filed on May 11, 2005 and 2006-113425 filed on Apr. 17, 2006 under 35 USC §119, the entirety of all of which are incorporated herein by reference as if fully set forth herein.

BACKGROUND OF THE INVENTION

1. Field of the Invention

The present invention relates to a shielding casing for preventing radiation noise radiated from a printed circuit board or a cable in an electronic product, and to an electronic product.

2. Description of the Related Art

In recent years, with the increase in operating speed and the improvement in performance of electronic products, radiation noise radiated from an electronic product affects another electronic product and this becomes a problem. The influence of the radiation noise on the another electronic device is called electromagnetic interference (EMI). The radiation noise causes reception interference in wireless products and communication products and malfunctions of electronic products in typical cases. Therefore individual countries enact regulations on radiation noise from electronic products in the frequency band from 30 MHz to 1 GHz or the frequency band from 30 MHz to 2 GHz, and it is necessary for electronic product makers to design and produce products so as to meet the regulations.

There is generally used a method of covering a noise source such as a printed circuit board, a cable or a module in an electronic product with a shielding casing made of a metal, an electroconductive resin or a resin with a plating in order to reduce the above-described radiation noises and malfunctions due to external electromagnetic waves.

Figure 10:
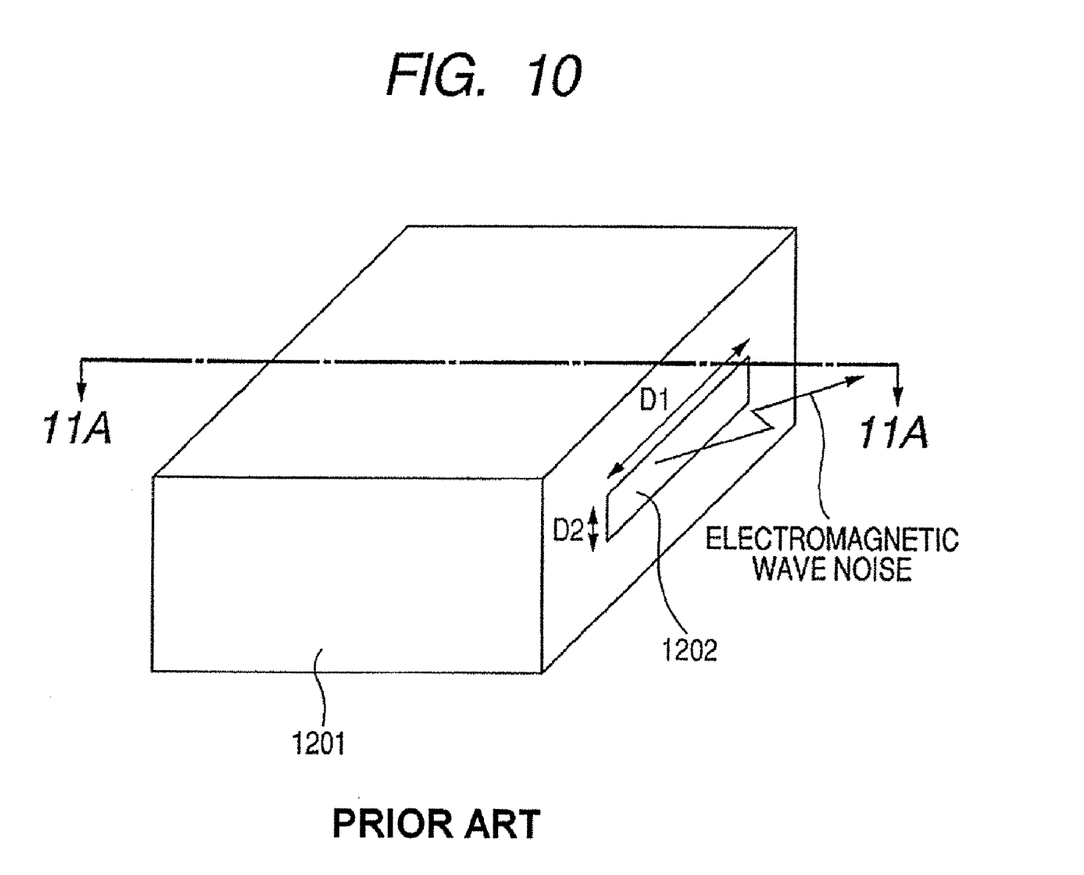
FIG. 10 is a perspective view of a conventional shielding casing.

However, it is necessary to provide an opening in the shielding casing as shown in FIG. 10 in order to connect the printed circuit board, cable or module placed in the shielding casing to the outside of the shielding casing. That is, in an office machine such as a copying machine or a printer, an opening is required as an optical path through which an optical signal converted from image information is sent to an optical sensor such as a CCD or a CMOS sensor. An opening formed as an optical path through which an optical signal converted by a semiconductor laser is sent to a photosensitive drum is also required. In some case, an opening formed as a paper path through which a sheet of paper is passed is required. As a condition for passage of light and paper, formation of an opening having a size equal to or larger than a certain size is required.

In FIG. 10, reference numeral 1201 denotes a shielding casing, and reference numeral 1202 denotes a rectangular opening formed for passage of light or paper and having two shorter sides and two longer sides. The length of the longer sides of the opening 1202 is D1 and the length of the shorter sides is D2. Radiation noise (electromagnetic waves) radiated from a noise source such as a printed circuit board placed in the shielding casing leaks out of the shielding casing through the opening 1202. Radiation noise (electromagnetic waves) leaking out through the opening 1202 occurs at all frequencies. The radiation level at each frequency is comparatively low and is not a serious problem.

In the case where the opening 1202 is provided in the shielding casing 1201, however, a signal at a specific frequency corresponding to the shape of the opening 1202 resonates and the opening 1202 itself functions as a slot antenna. That is, radiation noise at the specific frequency is emitted out of the shielding casing 1201 through the opening 1202. Radiation noise emitted through the opening 1202 functioning as a slot antenna occurs only at the specific frequency. However, this radiation noise has a considerably high radiation level and becomes a serious problem in meeting radiation noise regulations.

Figure 11A:
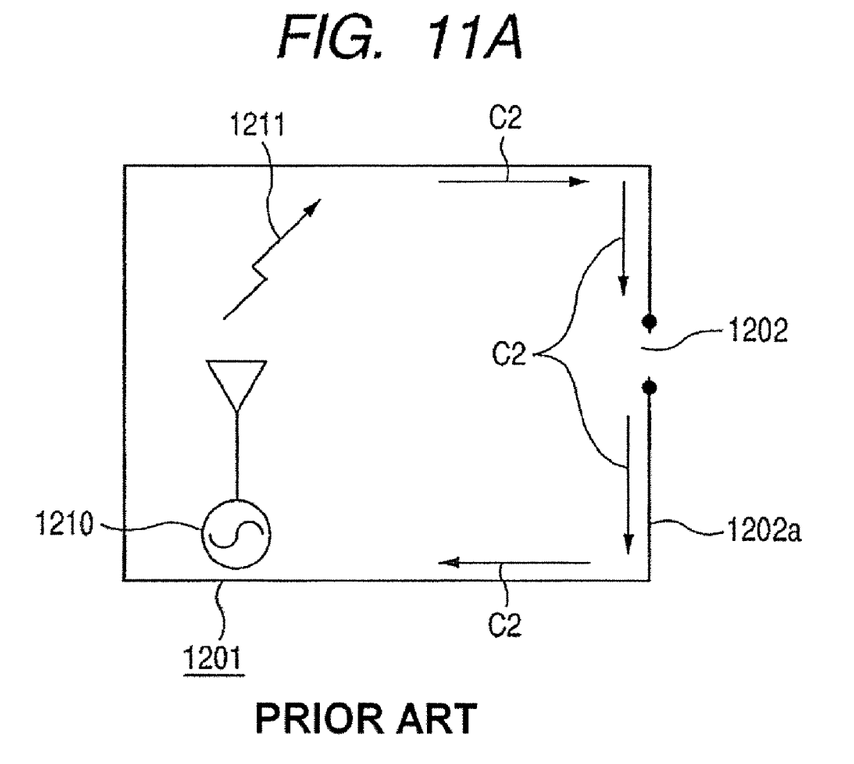
FIG. 11A is a cross-sectional view of the shielding casing taken in the line 11A-11A of FIG. 10.
Figure 11B:
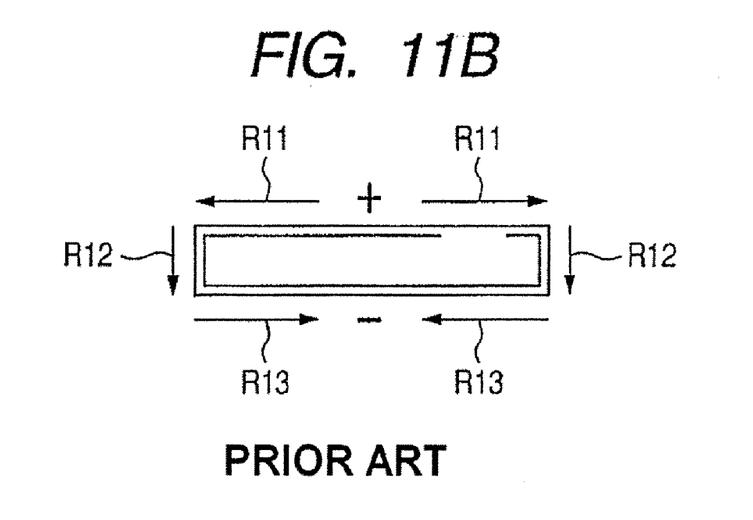
FIG. 11B is a diagram showing a state in which a current flows around an opening of the shielding casing shown in FIG. 10.

The principle of functioning the opening 1202 as a slot antenna to emit a radiation noise through the opening 1202 at a specific frequency will be described with reference to FIGS. 11A and 11B. FIG. 11A is a cross-sectional view of the shielding casing 1202 taken in the line 11A-11A of FIG. 10. FIG. 11B is a diagram schematically showing a state in which currents flow in an external surface of the shielding casing 1202 around the opening 1202.

As shown in FIG. 11A, radiation noise 1211 is emitted from a noise source 1210 such as a printed circuit board. Radiation noise 1211 enters a ground current C2 flowing in an internal surface of the shielding casing 1201, and the ground current C2 becomes a current having a noise component. The ground current C2 having the noise component flows into the external surface of the shielding casing 1201 by taking a tuning path through the shielding casing opening 1202. As shown in FIG. 11B, the ground current C2 flowing into the external surface of the shielding casing 1201 flows through paths R11→R12→R13 in the external surface of the shielding casing 1201 detouring the opening 1202.

At this time, the ground current C2 causes standing waves at such a frequency that the ½ wavelength is equal to the length (D1) of the longer sides of the shielding casing 1201. Along the upper side of the shielding casing opening 1202, a standing wave having a "+" phase is generated. Along the lower side of the shielding casing opening 1202, a standing wave having a "−" phase is generated. That is, standing waves having a phase difference of π are generated close to each other between the upper and lower sides of the shielding casing opening 1202, thereby generating an electric field large in the vertical direction between the upper and lower sides. As a result, a signal having the frequency at which the ½ wavelength is equal to D1 resonates and become radiation noise, which is radiated out of the shielding casing 1201.

The noise component at a specific frequency when becomes a problem is a noise component having a frequency at which the ½ wavelength is equal to the length (D1) of each side of the opening 1201. Conventionally, the generation of radiation noise from the opening 1202 functioning as a slot antenna is prevented by setting the length (D1) of the longer sides of the opening 1202 to a value equal to or smaller than the ½ wavelength at the maximum of frequencies at which a regulation is required.

For example, when the length (D1) of the longer sides of the opening 1202 is 30 cm, radiation noise of 500 MHz at which the ½ wavelength is 30 cm is generated. Therefore, prevention of radiation noise of a frequency equal to or lower than 500 MHz requires setting the length of the longer sides of the opening 1202 to 30 cm or less.

Standing waves are generated along the shorter sides corresponding to the length (D2) of the shorter sides in the same manner as those along the longer sides to emit radiation noise. However, the frequency of radiation noise generated in association with the shorter sides is much higher than that of radiation noise generated in association with the longer sides. Therefore, not radiation noise generated in association with the shorter sides but radiation noise generated in association with the longer sides is a consideration.

Figure 12:
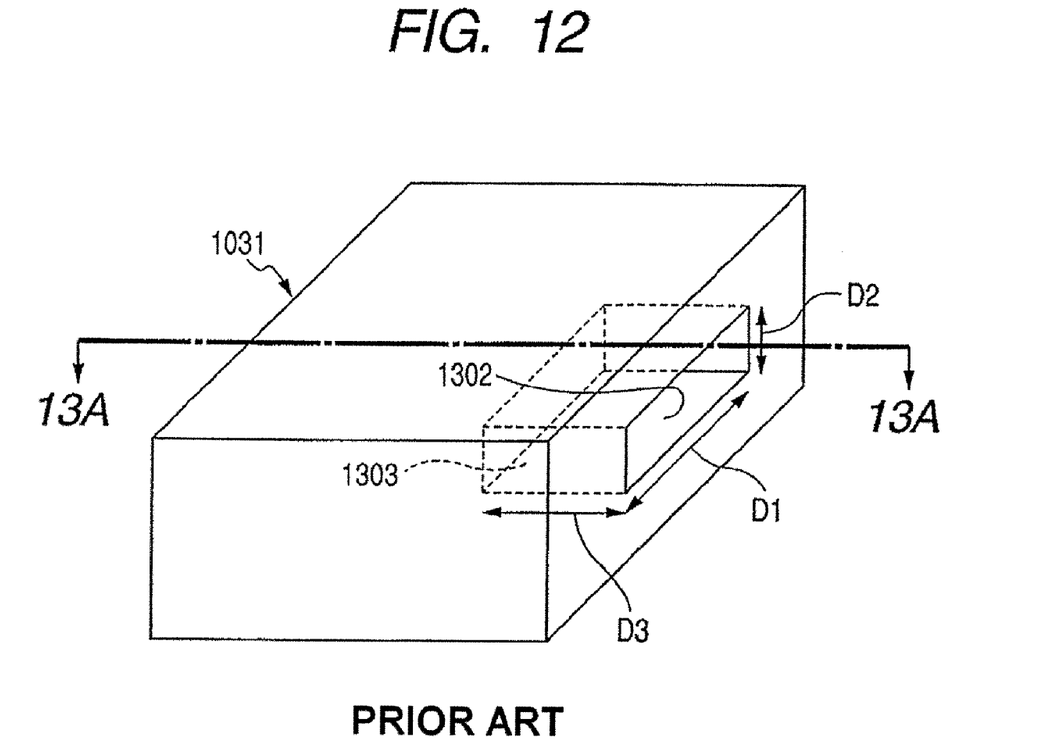
FIG. 12 is a perspective view of a conventional shielding casing.

Japanese Patent Application Laid-Open No. H08-32762 discloses a structure for shielding noise in an optical system. FIG. 12 is a perspective view of the structure. In FIG. 12, reference numeral 1301 denotes a shielding casing, and reference numeral 1302 denotes an opening in rectangular form for passage of light or paper having two shorter sides and two longer sides. The length of the longer sides of the opening 1302 is D1 and the length of the shorter sides is D2. A tube-shaped electroconductive member 1303 having substantially the same sectional shape as that of the opening 1302 and having a length D3 is attached inside the opening 1302. The tube-shaped electroconductive member 1303 is capable of preventing a radiation noise leaking from the interior of the shielding casing 1301 through the opening 1302 by utilizing a low-frequency-range shielding characteristic of a waveguide. That is, the radiation noise (electromagnetic waves) leaking out through the opening 1302 is reflected on an internal surface of the tube-shaped electroconductive member 1303, whereby the tube-shaped electroconductive member 1303 thus functions as a noise filter.

Figure 13A:
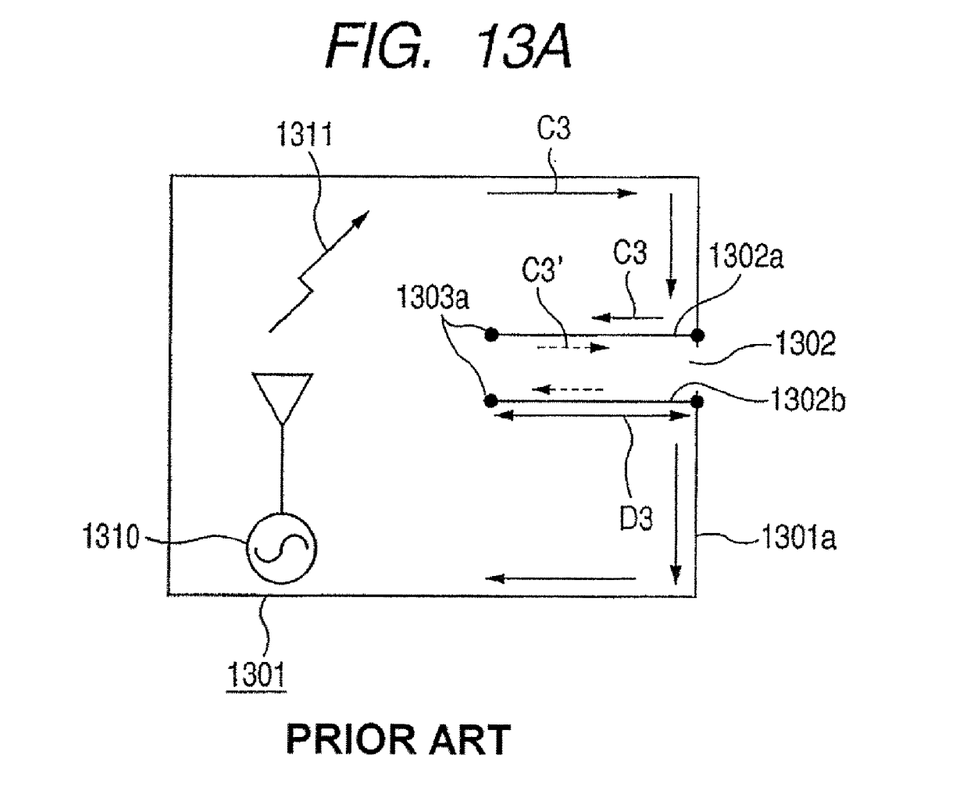
FIG. 13A is a cross-sectional view of the shielding casing taken in the line 13A-13A of FIG. 12.
Figure 13B:
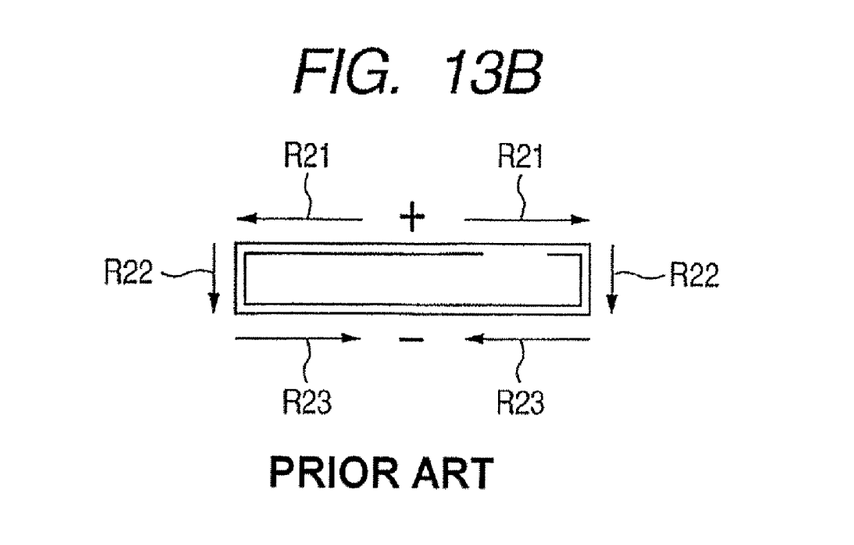
FIG. 13B is a diagram showing a state in which a current flows around an opening of the shielding casing shown in FIG. 12.

The principle of emission of noise in the shielding casing 1301 shown in FIG. 12 will be described with reference to FIGS. 13A and 13B. FIG. 13A is a sectional view of the shielding casing 1302 taken in the line 13A-13A of FIG. 12. FIG. 13B is a diagram schematically showing a state in which a current flows in a tube-shaped end portion 1303a of the tube-shaped electroconductive member 1303 far away from the opening 1302 of the shielding casing 1301 shown in FIG. 12.

As shown in FIG. 13A, radiation noise 1311 is emitted from a noise source 1310 such as a printed circuit board Radiation noise 1311 enters a ground current C3 flowing in an internal surface of the shielding casing 1301, and the ground current C3 becomes a current having a noise component. The ground current C3 having the noise component flows into an outer surface of the tube-shaped electroconductive member 1303 and reaches the tube-shaped end portion 1303a.

As shown in FIG. 13B, the ground current C3 flows through paths R21→R22→R23 in the tube-shaped end portion 1303a. At this time, a noise component of a frequency at which the ½ wavelength is equal to the length (D1) of the longer sides of the shielding casing 1201 in noise components of the ground current C3 causes standing waves corresponding to the shape of the tube-shaped end portion 1303a. Along the upper side of the tube-shaped end portion 1303a, a standing wave having a "+" phase is generated. Along the lower side of the tube-shaped end portion 1303a, a standing wave having a "−" phase is generated. That is, standing waves having a phase difference of π are generated close to each other between the upper and lower sides of the tube-shaped end portion 1303a, thereby generating a large electric field in the vertical direction between the upper and lower sides. A signal having the frequency at which the ½ wavelength is equal to D1 resonates and become radiation noise. This radiation noise passes through the tube-shaped end portion 1303 and the opening 1302 to be radiated out of the shielding casing 1201, because the tube-shaped electroconductive member 1303 has substantially no effect of preventing passage of electromagnetic waves having frequencies equal to or higher than 500 MHz.

A part of the ground current C3 reaching a tube-shaped end portion 1304 flows into the internal surface of the tube-shaped electroconductive member 1303 and into the external surface of the shielding casing 1201 by taking a roundabout path. Ground current C3' flowing into the external surface of the shielding casing 1201 downstream of the roundabout path flows through paths R11→R12→R13 in the external surface of the shielding casing 1301 detouring the opening 1302, as does the current shown in FIG. 11B. As a result, a signal having the frequency at which the ½ wavelength is equal to D1 resonates and become radiation noise, which is radiated out of the shielding casing 1301.

However, the upper limit of frequencies under noise regulations has been increased year after year. For example, when the necessary maximum shielding frequency is 2 GHz, the corresponding wavelength is 15 cm. It is necessary to set the length (D1) of the longer sides of the opening to a value equal to or smaller than ½ of the wavelength corresponding to the necessary maximum noise shielding frequency, i.e., 7.5 cm or less in the case of the shielding casing shown in FIG. 10. It is not practical to apply this condition to the opening through which light or paper is passed in the above-described office machine, because the opening is made too small to use.

In the shielding casing disclosed in Japanese Patent Application Laid-Open No. H08-32762, the tube-shaped electroconductive member 1303 is attached to the opening from the inside of the shielding casing and the low-frequency-range shielding characteristic of a waveguide is utilized to prevent leakage of radiation noise through the opening 1302. The low-frequency shielding characteristic is effective in preventing radiation noise of comparatively longer wavelengths, i.e., frequencies of 500 MHz or less, and the preventing effect is considerably reduced if the frequency is increased. Therefore, substantially no preventing effect can be obtained with respect to radiation noise of 1 GHz or 2 GHz radiated from the slot antenna.

SUMMARY OF THE INVENTION

In view of the above-described problem, an object of the present invention is to provide a shielding casing and an electronic product capable of effectively preventing radiation noise of high frequencies of 500 MHz or higher generated from the electronic product, by using a simple structure.

To achieve the above-described object, according to the present invention, there is provided a shielding casing for including an electronic component, comprising: a plurality of electroconductive walls; an opening formed in at least one electroconductive wall; a tube-shaped electroconductive member attached to the wall from the inside of the shielding casing so as to surround the opening, wherein the tube-shaped electroconductive member has two slits extending in an axial direction of the member from an end position far away from the opening.

The above and other objects of the invention will become more apparent from the following embodiments taken in conjunction with the accompanying drawings.

DETAILED DESCRIPTION OF PREFERRED EMBODIMENTS

Embodiments of the present invention will be described with reference to the accompanying drawings.

First Embodiment

Figure 1:
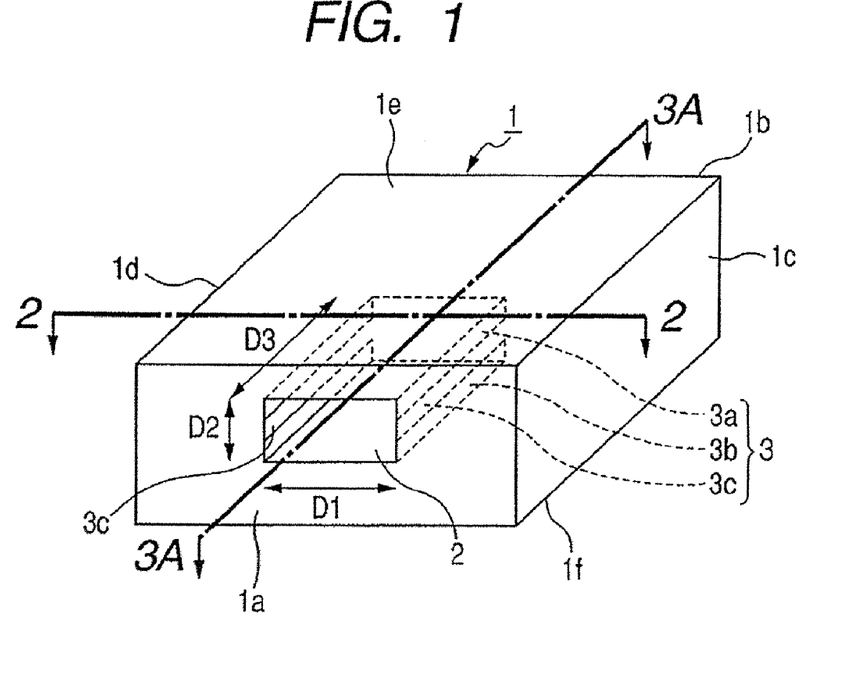
FIG. 1 is a perspective view of a shielding casing according to a first embodiment of the present invention.
Figure 2:
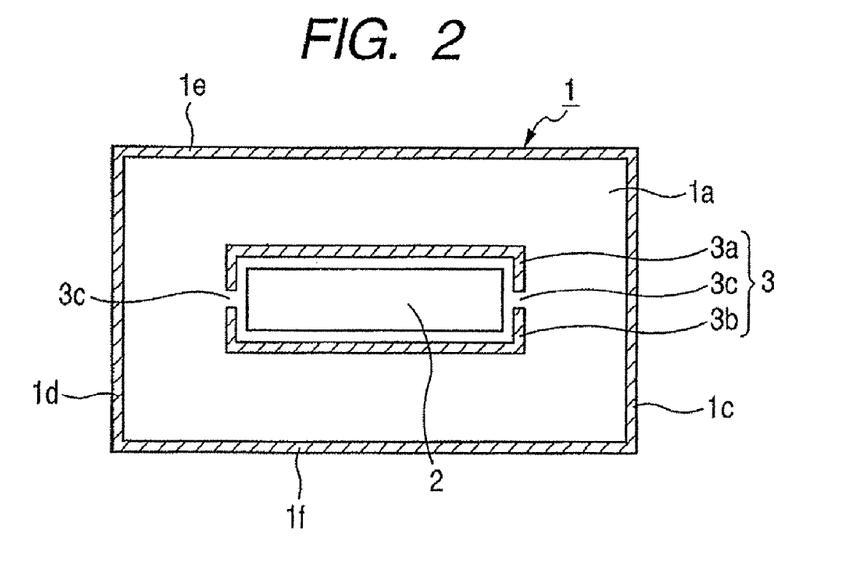
FIG. 2 is a cross-sectional view of the shielding casing taken in the line 2-2 of FIG. 1.

FIGS. 1 to 3B are diagrams showing a shielding casing in accordance with the present invention. FIG. 1 is a perspective view of a shielding casing 1; FIG. 2 is a cross-sectional view taken in the line 2-2 of FIG. 1; and FIG. 3A is a cross-sectional view taken in the line 3A-3A of FIG. 1. A printed circuit board or the like acting as a radiation noise source 10 is placed in the shielding casing 1. The shielding casing 1 is in the form of a rectangular block and formed by electroconductive side wall members 1a to 1d, a ceiling member 1e, and a bottom member 1f. In the side wall member 1a, a rectangular opening having two shorter sides and two longer sides is formed. The length of the longer sides of the opening 2 is D1 and the length of the shorter sides is D2. A tube-shaped electroconductive member 3 is attached to the shielding casing 1 at the opening 2 from the inside of the shielding casing 1. The tube-shaped electroconductive member 3 is formed of two electroconductive members 3a and 3b each having a U-shaped (which means U-shape having a corner or no corner) section and opposed to each other on the opening sides of the U-shape so as to surround the periphery of the opening 2. That is, the construction of the tube-shaped electroconductive member 3 is such that two slits 3c are formed in two side surfaces of the tube-shaped electroconductive member 3 to divide the tube-shaped electroconductive member 3 into the two electroconductive conductive members 3a and 3b.

The principle of preventing a radiation noise by the divided electroconductive member 3 shown in FIG. 1 will be described with reference to FIGS. 3A and 3B. FIG. 3B is a diagram schematically showing a state in which a current flows in U-shaped end portions 3a' and 3b' of the U-shaped electroconductive members 3a and 3b shown in FIG. 1, which are located far away from the side wall member 1a of the electroconductive member 3 formed of the U-shaped electroconductive members 3a and 3b. Referring to FIG. 3B, the electroconductive member 3 is divided into the two U-shaped electroconductive members 3a and 3b and the U-shaped end portions 3a' and 3b' are also separated by the slits 3c.

Figure 3A:
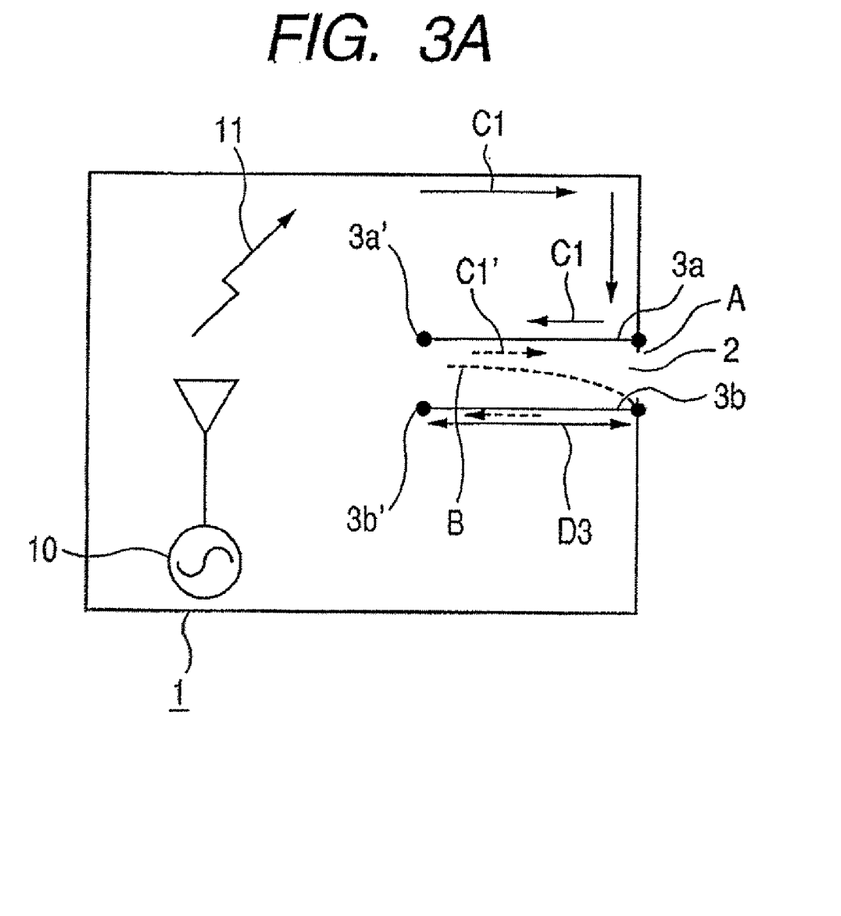
FIG. 3A is a cross-sectional view of the shielding casing taken in the line 3A-3A of FIG. 1.
Figure 3B:
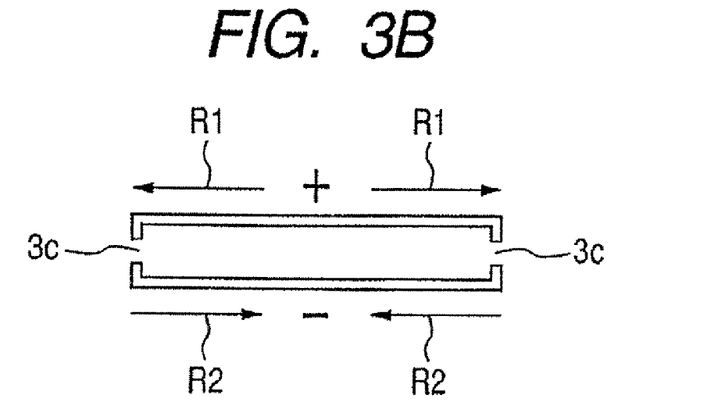
FIG. 3B is a diagram showing a state in which a current flows around an opening of the shielding casing shown in FIG. 1.

As shown in FIG. 3A, radiation noise 11 is emitted from the noise source 10, e.g., a printed circuit board. Radiation noise 11 enters a ground current C1 flowing in an internal surface of the shielding casing 1, and the ground current C1 becomes a current having a noise component. The ground current C1 having the noise component flows into an outer surface (upper surface) of the U-shaped electroconductive member 3a and reaches the U-shaped end portion 3a'.

As shown in FIG. 3B, ground current C1 flows through a path R1 in the U-shaped end portion 3a' but does not flow into the U-shaped electroconductive member 3b having the U-shaped end portion 3b', since the slits 3c exist. Therefore, at the U-shaped end portions 3a' and 3b', the noise component having the frequency at which the ½ wavelength is equal to the length (D1) of the longer sides does not resonate and is not radiated as radiation noise.

An extremely small part of the ground current C1 flows into an inner surface of the U-shaped electroconductive member 3a by taking a roundabout path via the U-shaped end portion 3a' or the end portion of the electroconductive member 3a forming the slits 3c. Ground current C1' downstream of the roundabout path flows into the external surface of the shielding casing 1 via the opening 2 and resonates corresponding to the shape of the opening 2 to radiate radiation noise, as shown in FIG. 11B. However, ground current C1' flowing into the external surface of the shielding casing 1 is much smaller than that in FIG. 10, and the amount of radiation noise is not a problem with respect to the regulated value.

The depth D3 of the U-shaped electroconductive members 3a and 3b in the direction perpendicular to the opening 2 may be set to ½ of the length (D1) of the longer sides of the opening 2 to minimize ground current C1' flowing into the external surface of the shielding casing 1. This is because the U-shaped electroconductive member 3a is electrically short-circuited by being electrically connected at a point A of FIG. 3A to the side wall member 1a forming the plane of the opening 2. On the other hand, the U-shaped end portions 3a' and 3b' of the U-shaped electroconductive members 3a and 3b are open ends. Also, the impedance at the U-shaped end portion 3a' is maximized at the distance corresponding to the ¼ wavelength from point A as indicated by dotted line B of FIG. 3A. If this impedance is increased, ground current C1' flowing from point A toward the U-shaped end portion 3a' is reduced. Accordingly, the current flowing from the U-shaped end portion 3a' into the external surface of the shielding casing 1 is reduced, thus preventing radiation noise.

That is, a ground current to be resonated at the opening 2 is a ground current having a noise component of the frequency at which the ½ wavelength is equal to the length (D1) of the longer sides of the opening 2. For minimization of the amount of a current flowing into the external surface of the shielding casing 1 with respect to this ground current, the depth D3 of the electroconductive member 3a may be set to the ¼ wavelength of this noise component. That is, the effect of preventing radiation noise is maximized when the depth D is set to the ½ of the length (D1) of the longer sides of the opening 2.

Figure 4A:
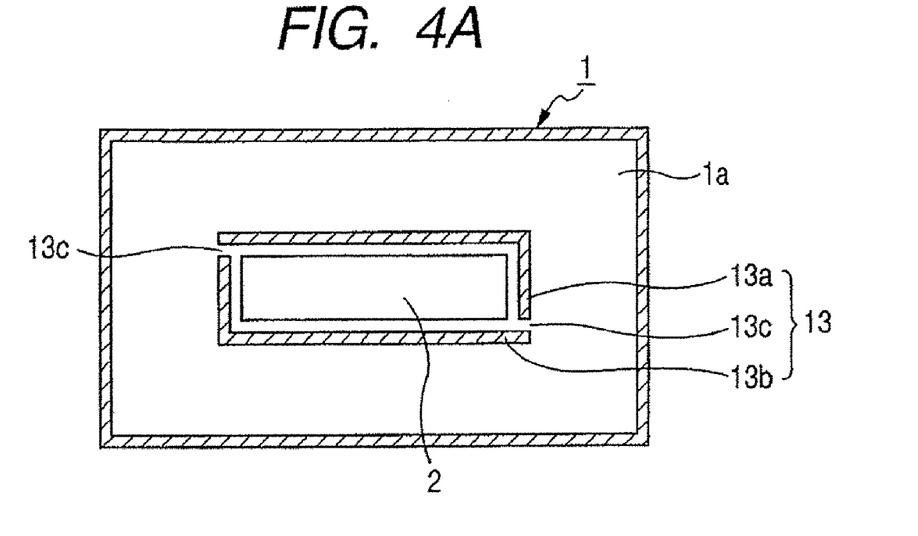
FIGS. 4A, 4B, and 4C are cross-sectional views of other forms according to the first embodiment.
Figure 4B:
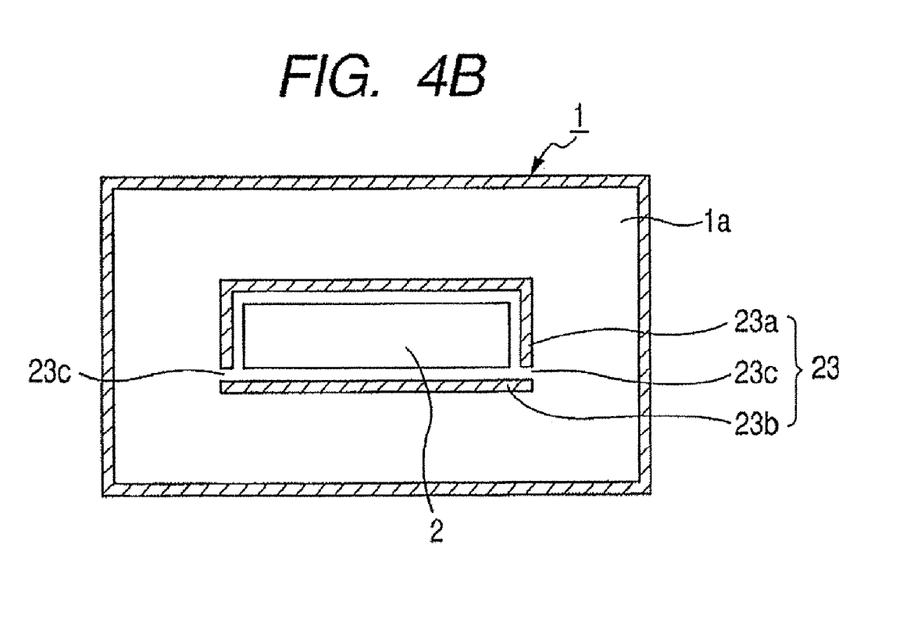
Figure 4C:
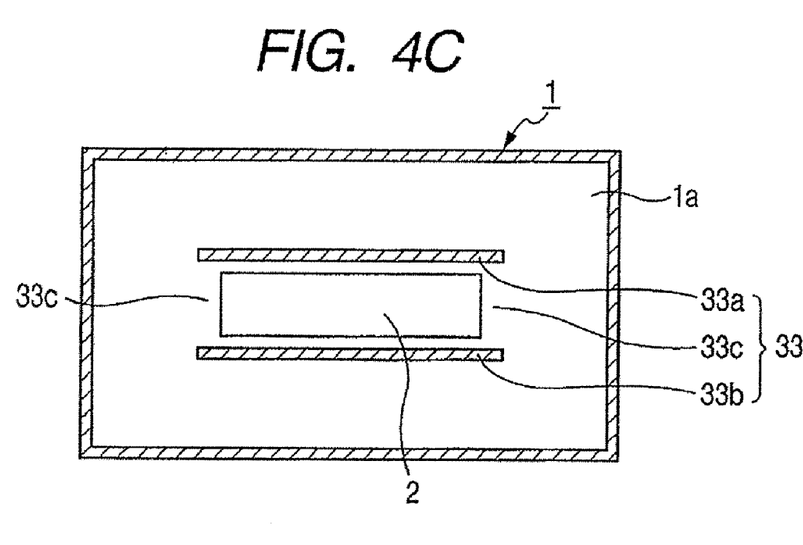

The present invention is not limited to the structure in which the electroconductive member 3 is divided into U-shaped electroconductive members 3a and 3b such as shown in FIG. 1. An electroconductive member 13 such as shown in FIG. 4A may alternatively be used which is divided into L-shaped electroconductive members 13a and 13b by providing slits 13c at diagonal corners of the electroconductive member 13, as shown in FIG. 4A. Also, an electroconductive member 23 such as shown in FIG. 4B may be used in which two slits 23c are provided at one of the two longer sides of the opening 2 to form a U-shaped electroconductive member 23a and a flat electroconductive member 23b, which are combined to form the electroconductive member 23. Further, an electroconductive member such as shown in FIG. 4C may be used in which the width of slits 33c is equal to the length of the shorter sides of the opening 2, that is, flat electroconductive members 33a and 33b are formed.

EXPERIMENTAL EXAMPLE 1

Figure 5:
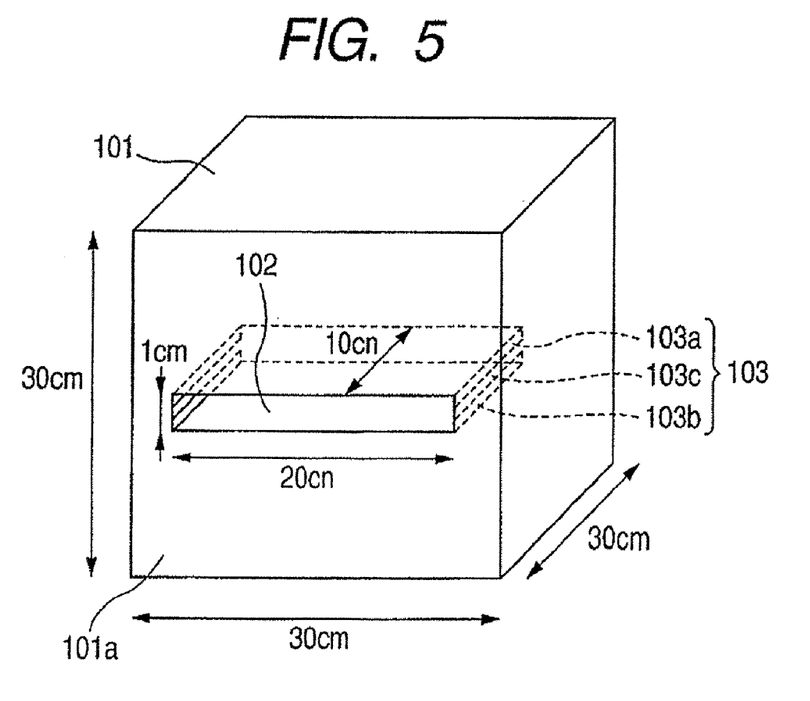
FIG. 5 is a perspective view of a simulation model for the shielding casing in Experimental Example 1.

To ascertain the above action, an electromagnetic field simulation was performed with respect to a shielding casing having a rectangular opening having two shorter sides and two longer sides to compute the amount of emission of radiation noise. FIG. 5 shows a simulation model used in this simulation. Referring to FIG. 5, a shielding casing 101 has the shape of a cube having each side of 30 cm in length. An opening 102 having a width of 20 cm (D1) in the horizontal direction and a height of 1 cm (D2) in the vertical direction is provided in one surface 101a of the shielding casing 101. A tube-shaped electroconductive member 103 is attached to the shielding casing 101 at the opening 102 from the inside of the shielding casing 101. The depth (D3) of the tube-shaped electroconductive member 103 in the direction perpendicular to the opening 102 is 10 cm. Slits 103c having a width of 4 mm are provided in both side surfaces of the tube-shaped electroconductive member 103 to divide the electroconductive member 103 into two electroconductive members 103a and 103b each having a U-shaped section. The electroconductive members 103a and 103b are opposed so as to face the opening sides of the U-shape to each other and surround the periphery of the opening 2. A noise source (not shown) having a fundamental wave of 20 MHz is placed inside the shielding casing 101.

Figure 6:
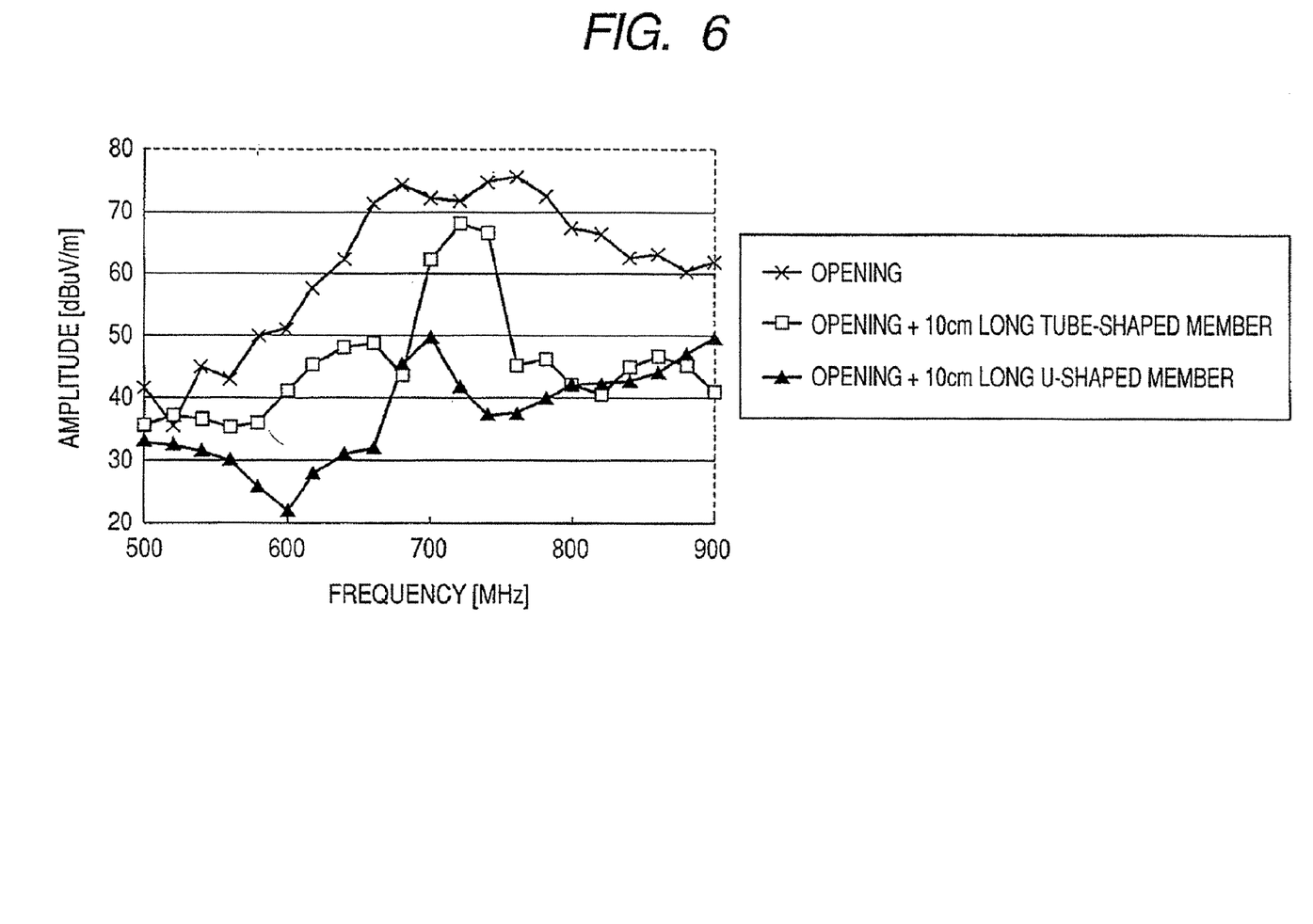
FIG. 6 is a graph showing the results of computation in Experimental Example 1.

The electric field of a vertical component at a distance of 10 m from the shielding casing 101 was computed. FIG. 6 shows the results of the computation. In FIG. 6, the abscissa represents the frequency and the ordinate represents the amount of electromagnetic wave noise. The results of computation in a case where a shielding member is not provided at the opening 1202 as shown in FIG. 10 (Comparative Example 1) and a case where a tube-shaped electroconductive member having the same opening size as of the opening 1302 shown in FIG. 12 and a length of 10 cm (Comparative Example 2) is provided are also shown for comparison.

Symbol ▲ indicates the results of computation in Experimental Example 1 in which the 10 cm long tube-shaped electroconductive member is divided by the two slits. Symbol × indicates the results of computation in Comparative Example 1 in which no shielding member is provided at the opening as shown in FIG. 10. Symbol indicates □ indicates the results of computation in Comparative Example 2 in which a tube-shaped electroconductive member such as shown in FIG. 12 having the same opening size as the opening 102 and a length of 10 cm is provided at the opening.

In Comparative Example 1 indicated by × in FIG. 6, steep peeks are observed through a wide range from 600 to 800 MHz. It is considered that the frequency at which the ½ wavelength is equal to the length (D1) 20 cm of the longer sides of the opening is 720 MHz, and that radiation noise is emitted about 720 MHz. In Comparative Example 2 indicated by □ in FIG. 6, noise is markedly reduced at each frequency in comparison with Comparative Example 1. However, the noise component at 720 MHz generated by resonance shows a steep peak without being substantially reduced.

In contrast, in Experimental Example 1 indicated by ▲, noise is markedly reduced even in comparison with Comparative Example 2. Further, the noise components at 720 MHz generated by resonance is significantly reduced. It is generally preferred that the level of radiation noise in electronic products be prevented to 60 dbuV/m or less. In Experimental Example 1, the level of radiation noise is 60 dbuV/m or less through the entire frequency range. Thus, the obtained value can be said to be low enough for use in electronic products.

EXPERIMENTAL EXAMPLE 2

The amount of emission of radiation noise when the depth (D3) of the tube-shaped electroconductive member 103 in the direction perpendicular to the opening 102 was set to 5 cm, 7.5 cm, 10 cm, 12.5 cm and 15 cm in the simulation model shown in FIG. 5 was computed.

Figure 7:
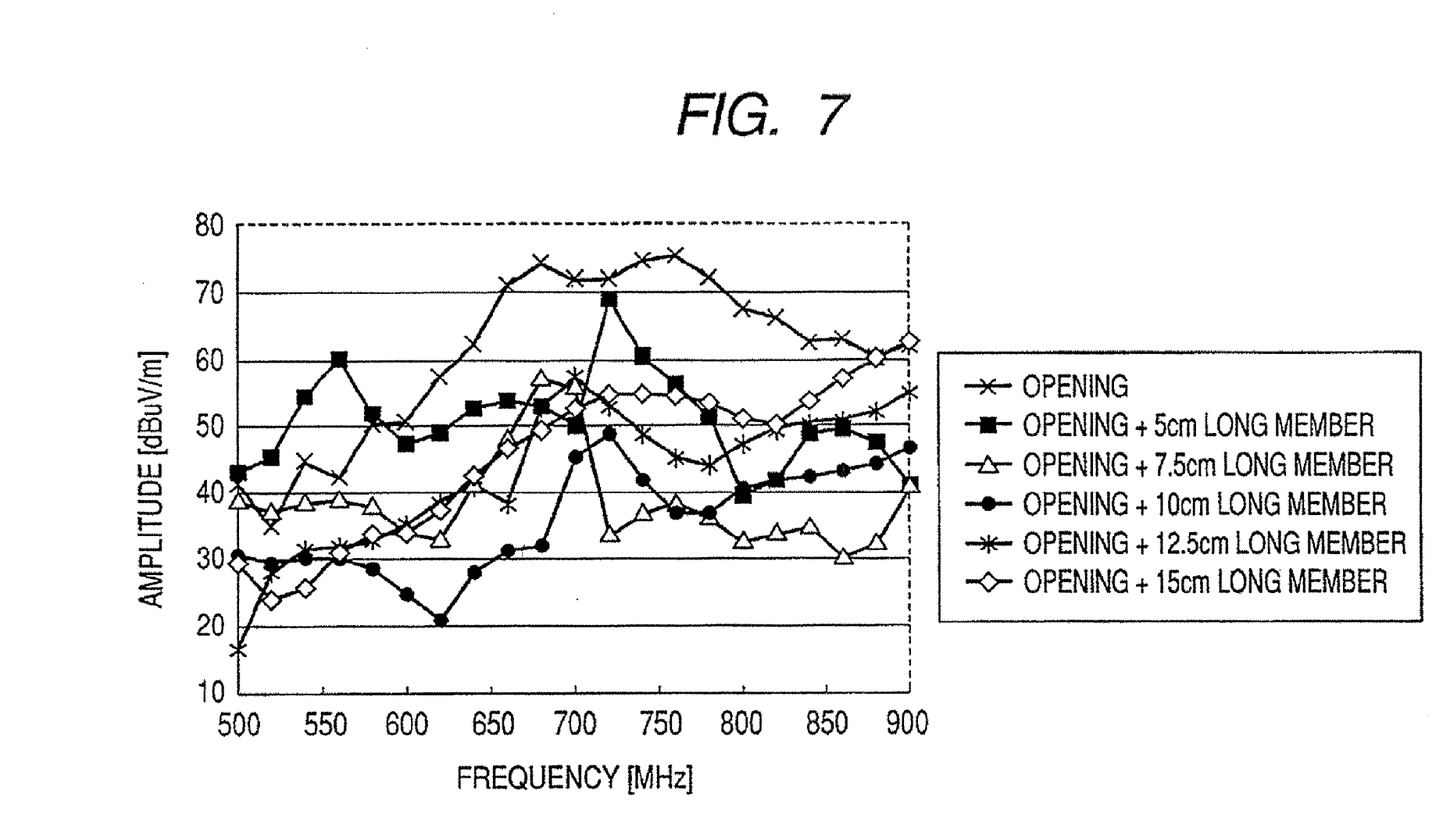
FIG. 7 is a graph showing the results of computation in Experimental Example 2.

The electric field of a vertical component at a distance of 10 m from the shielding casing 101 was computed in the same manner as in Experimental Example 1. FIG. 7 shows the results of the computation. In FIG. 7, the abscissa represents the frequency and the ordinate represents the amount of electromagnetic wave noise. Symbol □ indicates the results when D3 was 5 cm; symbol Δ the results when D3 was 7.5 cm; symbol ● the results when D3 was 10 cm; symbol * the results when D3 was 12.5 cm; and symbol ◇ indicates the results when D3 was 15 cm. The above-described comparative example 1 is indicated by × for comparison.

As can be seen from FIG. 7, the noise reduction effect is maximized through the entire frequency range when D3 is 10 cm and is reduced as D3 is reduced or increased from 10 cm. 10 cm is ½ of the length D1 of the longer sides of the opening 102. That is, 10 cm is the length corresponding to the ¼ wavelength with respect to the noise component having the frequency at which the ½ wavelength is equal to the length (D1) of the longer sides of the opening, and at which the opening operates as a slot antenna. It can be said that the noise reduction effect is maximized when this condition is satisfied.

Second Embodiment

Figure 8:
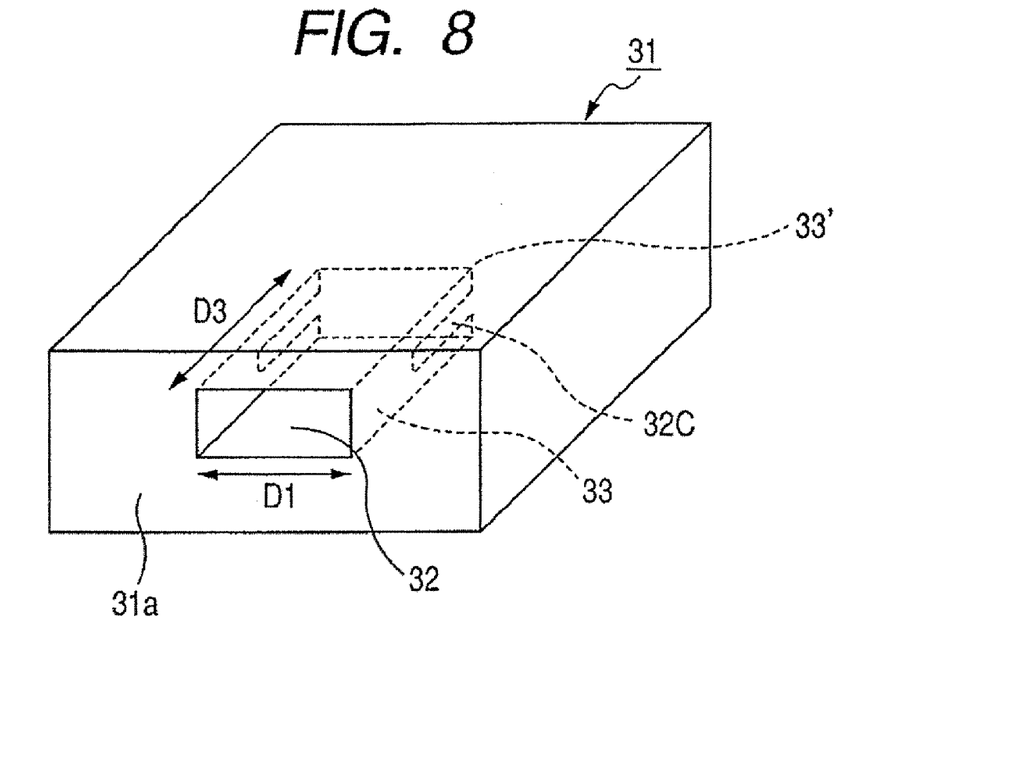
FIG. 8 is a perspective view of a shielding casing according to a second embodiment of the present invention.

FIG. 8 is a perspective view of a shielding casing 31 according to a second embodiment of the present invention. The description for the same portions as those of the first embodiment shown in FIG. 1 will be omitted. In the embodiment shown in FIG. 1, the tube-shaped electroconductive member 3 is separated into the two electroconductive members 3a and 3b by the slits 3c. This embodiment differs from the embodiment shown in FIG. 1 in that two slits 33c provided in a tube-shaped electroconductive member 33 do not separate the electroconductive member 33 into two, and that the slits 33c are formed as cutouts extending from the end of the member far away from the opening 2. That is, two side surfaces of the tube-shaped electroconductive member 33 are made generally U-shaped by forming the slits 33c.

This configuration ensures that end portion 33' of the tube-shaped electroconductive member 33 far away from the shielding casing 31 are separated by the slits 33c to avoid the formation of a slot antenna. The length of the tube-shaped electroconductive member 33 may be set to half the length D1 of the longer sides of the opening of the shielding casing like that in the first embodiment to maximize the noise reduction effect.

Third Embodiment

Figure 9:
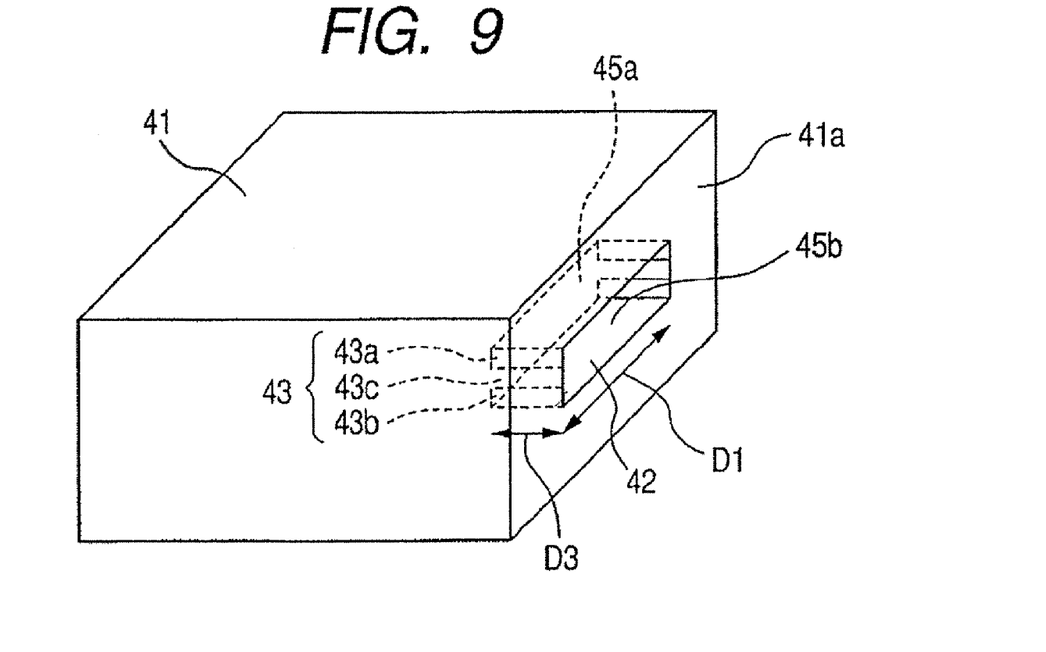
FIG. 9 is a perspective view of a shielding casing according to a third embodiment of the present invention.

FIG. 9 shows a shielding casing according to a third embodiment of the present invention. Referring to FIG. 9, a tube-shaped electroconductive member 43 is separated into two U-shaped electroconductive members 43a and 43b by slits 43c, and dielectric members 45a and 45b are placed on an interior upper surface of the U-shaped electroconductive member 43a and on an interior lower surface of the U-shaped electroconductive member 43b, respectively. The dielectric members 45a and 45b reduce the wavelength of electromagnetic waves. Accordingly, the same effect can be achieved while the length D3 of the U-shaped electroconductive members 43a and 43b is reduced relative to ½ of the longer sides of the opening 42.

The length of the U-shaped electroconductive members 43a and 43b on which the dielectric members 45a and 45b are placed may be set to such a value that an electrical length computed from the effective specific dielectric constant of the space around the dielectric members 45a and 45b is equal to ½ of the length D1 of the longer sides of the opening. For example, when the effective specific dielectric constant of the dielectric members 45a and 45b and the space around the dielectric members 45a and 45b is 4, the length D3 of the U-shaped electroconductive member 43 with the dielectric members 45a and 45b attached to the opening 42 may be set to ¼ of the length of the longer sides of the opening.

What is claimed is:

1. A shielding casing for placing an electronic component in, comprising:
   a plurality of electroconductive side walls;
   an electroconductive ceiling member;
   an electroconductive bottom member;
   an opening formed in one of the electroconductive side walls; and
   a tube-shaped electroconductive member attached to an inside surface of the side wall having the opening so as to surround the opening,
   wherein the tube-shaped electroconductive member has two opposed slits extending in an axial direction of the member from an end position of the member far away from the opening.

2. The shielding casing according to claim 1, wherein the tube-shaped electroconductive member is divided into two component parts by the slits.

3. The shielding casing according to claim 2, wherein the opening has a shape of a rectangle having two shorter sides and two longer sides, and each of the two component parts is a U-shaped electroconductive member.

4. A shielding casing for placing an electronic component in, comprising:
   a plurality of electroconductive side walls;
   an electroconductive ceiling member;
   an electroconductive bottom member;
   an opening formed in one of the electroconductive side walls and having a shape of a rectangle having two shorter sides and two longer sides; and
   two U-shaped electroconductive members attached to an inside surface of the side wall having the opening
   wherein the two U-shaped electroconductive members are arranged so that opening sides of the U-shaped electroconductive members are opposed to each other to form two slits extending from the two shorter sides of the opening.

5. A shielding casing for placing an electronic component in, comprising:
   an electroconductive ceiling member;
   an electroconductive bottom member;
   a plurality of electroconductive side walls associated with the electroconductive ceiling member and the electroconductive bottom member;
   an opening formed in one of the electroconductive side walls; and
   a tube-shaped electroconductive member arranged to the inside surface of the side wall having the opening so as to surround the opening,
   wherein the tube-shaped electroconductive member has two opposed slits extending in an axial direction of the tube-shaped electroconductive member from an end position of the tube-shaped electroconductive member far away from the opening, and
   wherein a length (D3) of the slits is shorter than a longer length (D1) of the opening.

6. The shielding casing according to claim 5, wherein the opening has a shape of a rectangle having two shorter sides and two longer sides, and a length (D3) of the slits is shorter than a length (D1) of the two longer sides of the opening.

* * * * *